United States Patent
Ardehali

(10) Patent No.: US 7,760,032 B2
(45) Date of Patent: Jul. 20, 2010

(54) SELF-COMPENSATING VOLTAGE-CONTROLLED OSCILLATOR

(75) Inventor: Mohammad Ardehali, Camarillo, CA (US)

(73) Assignee: Tialinx, Inc., Newport Beach, CA (US)

( * ) Notice: Subject to any disclaimer, the term of this patent is extended or adjusted under 35 U.S.C. 154(b) by 29 days.

(21) Appl. No.: 11/738,333

(22) Filed: Apr. 20, 2007

(65) Prior Publication Data

US 2008/0258823 A1 Oct. 23, 2008

(51) Int. Cl.
*H03K 3/03* (2006.01)

(52) U.S. Cl. .............. 331/57; 331/175; 331/177 V

(58) Field of Classification Search ........... 331/36 C, 331/117 R, 117 FE, 15, 57, 167, 179, 177 V, 331/177 R; 327/336–337, 554; 324/519–522
See application file for complete search history.

(56) References Cited

U.S. PATENT DOCUMENTS

| | | | | |
|---|---|---|---|---|
| 5,777,520 A | * | 7/1998 | Kawakami | 331/1 R |
| 6,094,103 A | * | 7/2000 | Jeong et al. | 331/57 |
| 6,369,661 B1 | * | 4/2002 | Scott et al. | 331/45 |
| 6,621,362 B2 | * | 9/2003 | Momtaz et al. | 331/117 R |
| 6,690,243 B1 | * | 2/2004 | Henrion | 331/117 R |
| 6,864,753 B2 | * | 3/2005 | Lee et al. | 331/17 |
| 7,084,713 B2 | * | 8/2006 | Peluso | 331/179 |
| 7,102,446 B1 | * | 9/2006 | Lee et al. | 331/11 |
| 7,102,454 B2 | * | 9/2006 | Sze et al. | 331/117 FE |
| 7,176,737 B2 | * | 2/2007 | Baker et al. | 327/280 |
| 7,187,243 B2 | * | 3/2007 | Konno | 331/57 |
| 7,511,581 B2 | * | 3/2009 | Lee et al. | 331/34 |
| 7,518,458 B2 | * | 4/2009 | Nakamura et al. | 331/167 |
| 7,629,856 B2 | * | 12/2009 | Thaller | 331/57 |

* cited by examiner

*Primary Examiner*—James H. Cho
*Assistant Examiner*—Christopher Lo
(74) *Attorney, Agent, or Firm*—Haynes & Boone, LLP.

(57) ABSTRACT

In one embodiment, a voltage-controlled oscillator (VCO) is provided that includes: a plurality of differential inverter stages coupled to form a loop, each differential inverter stage having including a switched capacitor circuit configured to control a signal delay through the differential inverter stage responsive to a control circuit, whereby an output frequency for the VCO is inherently compensated against changes in semiconductor process variations and thermal variations.

20 Claims, 5 Drawing Sheets

SELF-COMPENSATING VOLTAGE-CONTROLLED OSCILLATOR

STATEMENT REGARDING FEDERALLY SPONSORED RESEARCH OR DEVELOPMENT

This invention was made with Government support under contract number FA9453-06-C-0037 awarded by AFRL (VSSS). AFRL(VSSS) has certain rights in the invention.

TECHNICAL FIELD

The present invention relates generally to oscillators, and more particularly to a voltage-controlled oscillator (VCO) configured to automatically compensate for semiconductor process variations and operating temperature changes.

BACKGROUND

If an odd numbered of inverters are coupled together in a loop, a ring oscillator results if the loop gain is greater than one. In contrast, if an even number inverters are coupled together in this fashion, a latch results such as a conventional SRAM cell, which is formed from a pair of cross-coupled inverters. To form a voltage-controlled oscillator (VCO), each inverter stage in a ring oscillator is configured so that its propagation delay is responsive to a control voltage. The resulting ring-oscillator-formed VCOs are important circuit building blocks in applications such as phase locked loops. Because of their common mode noise rejection and tuning properties, differential VCOs are particularly popular in such applications.

A conventional VCO 100 is illustrated in FIG. 1 having five differential inverter stages 101. As will be discussed further with regard to FIG. 2, each differential inverter stage is configured to steer a "tail current" I from a current source responsive to its differential input voltages. The propagation delay through each differential inverter stage and hence the output frequency of a differential output signal from output nodes 110 is controlled by a control voltage, $V_{cntl}$.

FIG. 2 illustrates a typical implementation for differential inverter stages 101. A differential pair of NMOS transistors Q1 and Q2 have their drains isolated from a supply voltage node $V_{cc}$ by PMOS transistors M2 and M3, respectively. Each PMOS transistor M2 and M3 has its gate controlled by the control voltage signal $V_{cntl}$ such that transistors M2 and M3 act as resistors in the triode mode of operation. Thus, the magnitude of the control voltage controls the resistance through transistors M2 and M3 and hence the signal delay in each inverter stage. Each transistor M2 and M3 may thus be represented by a variable resistor of resistance R determined by the control voltage. Differential input voltages $V_{in}^+$ and $V_{in}^-$ control the gates of transistors Q1 and Q2, whose sources are tied to a current source driving the tail current I. The drains of transistors Q2 and Q1 tie to the nodes for differential output voltages $V_{out}^+$ and $V_{out}^-$, respectively. Because transistors Q1 and Q2 form a differential pair, virtually the entire tail current I will steer through the transistor whose gate voltage is higher than a threshold voltage multiple as compared to the remaining gate voltage. For example, if $V_{in}^+$ is sufficiently higher than $V_{in}^-$, the tail current steers through Q1.

It can be shown that the output frequency of voltage-controlled oscillator 100 is proportional to the inverse of the propagation delay τ for each inverter stage 101. In general, the delay is proportional to resistance R through transistors M2 and M3. However, this delay is also affected by semiconductor process variations that, for example, affect the balance between n-channel and p-channel transistors in a particular wafer. A customer of a semiconductor foundry can never guarantee, a priori, what particular process corner will be used to manufacture a given batch of wafers. Thus, the output frequency of a VCO in response to a certain control voltage level cannot be predicted until it is known what semiconductor process variation (fast or slow corner) was used in its manufacture. In addition, temperature variations will also affect the frequency response of a VCO. Various compensation circuits have been developed to address VCO sensitivity to temperature and process variations. However, these circuits tend to be complex and thus add considerably to manufacturing cost.

Accordingly, there is a need in the art for an improved VCO that automatically compensates for process and temperature variations.

SUMMARY

In accordance with an aspect of the invention, a voltage-controlled oscillator (VCO) is provided that includes: a plurality of differential inverter stages coupled to form a loop, each differential inverter stage including a switched capacitor circuit configured to control a signal delay through the differential inverter stage responsive to a control voltage, whereby an output frequency for the VCO is inherently compensated against changes in semiconductor process variations and thermal variations.

In accordance with another aspect of the invention, a phase-locked loop (PLL) is provided that includes: a phase detector operable to compare the phase between a divided signal and an input signal to provide a phase detector output; a loop filter to filter the phase detector output to provide a tuning signal; and a voltage-controlled oscillator (VCO), wherein the VCO comprises a plurality of inverter stages, each inverter stage including a switched capacitor circuit configured to control a signal delay through the inverter stage responsive to the tuning signal, whereby an output frequency for the PLL is inherently compensated against changes in semiconductor process variations and thermal variations.

In accordance with another aspect of the invention, a ring oscillator (VCO) is provided that includes: an odd plurality of inverter stages coupled to form a loop, each inverter stage including a switched capacitor circuit configured to control a signal delay through the inverter stage responsive to a control voltage, whereby an output frequency for the VCO is inherently compensated against changes in semiconductor process variations and thermal variations.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 3:
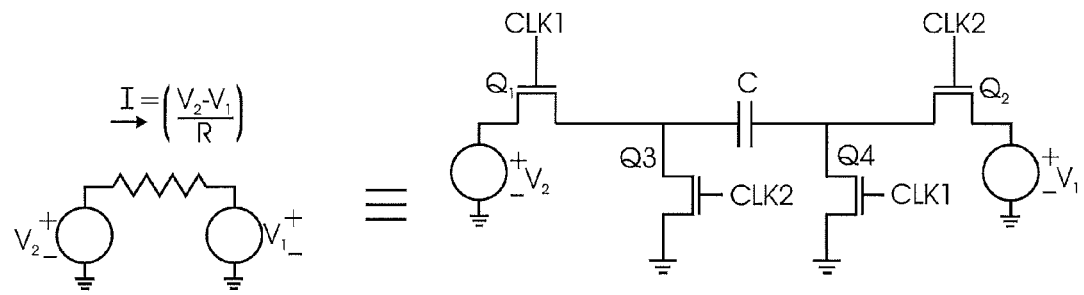
FIG. 3 illustrates the equivalence of a parasitic-insensitive switched capacitor circuit to a conventional resistor.

To provide a VCO having an output frequency that is independent of process and temperature variation, inverter stages are provided that each have a delay dependent on the resistance of a switched capacitor circuit. In general, resistance is defined as the proportionality between current and voltage in the well-known relationship known as Ohm's law. This same proportionality can be achieved using a switched-capacitor circuit such as illustrated in FIG. 3. FIG. 3 also illustrates an equivalent resistor R coupled between voltage sources V1 and V2. A current I through the resistor is given by Ohm's law as $$I = \frac{V_2 - V_1}{R} \quad (1)$$

The switched capacitor circuit transfers pulses of charge that, over time, may average to the same current flow I as follows. A switching cycle for the switched capacitor circuit includes a first phase in which a transistor Q1 and a transistor Q4 conduct while a transistor Q2 and a transistor Q3 are off. In a second phase, transistors Q2 and Q3 conduct while transistors Q1 and Q4 are off. To accomplish this switching, transistors Q1 and Q2 are controlled by non-overlapping clock signals Clk1 and Clk2, respectively. This switching cycle is repeated according to a switching frequency $f_{clk}$. Transistors Q3 and Q4 are controlled by clock signals Clk1 and Clk2 (respectively) so as to ground a terminal of a capacitor C coupled between transistors Q1 and Q2 during the charging cycles to provide parasitic insensitivity. The amount of charge transferred during each of these switching cycles is given by (V2-V1)*C, where C also represents the capacitance of a capacitor C coupled between Q1 and Q2. It can thus be shown that the average current I conducted by the switched-capacitor circuit is given by $$I = C*(V2-V1)*f_{clk} \quad (2)$$

In turn, from equation (2) it may be seen that the equivalent resistance R of the switched-capacitor circuit is given by $$R = \frac{1}{f_{clk} C} \quad (3)$$

Thus, by adjusting the switching frequency and the capacitance C, a circuit designer may achieve a desired resistance without a traditional resistor by using an appropriate switched capacitor circuit.

Figure 2:
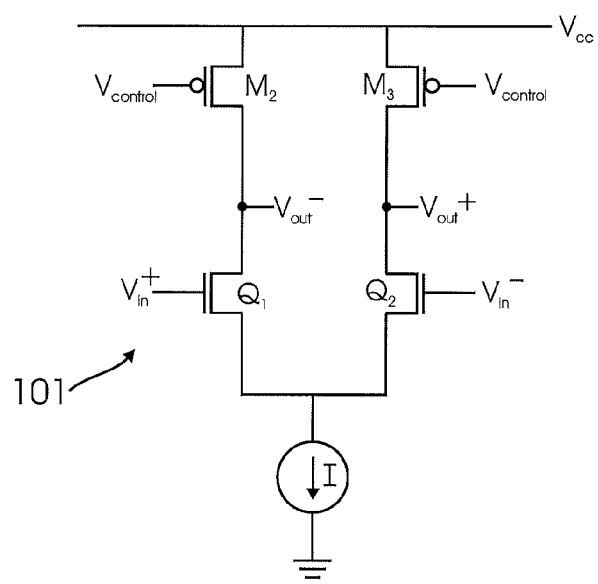
FIG. 2 is a circuit diagram of a conventional differential inverter stage for the voltage-controlled oscillator of FIG. 1.
Figure 4:
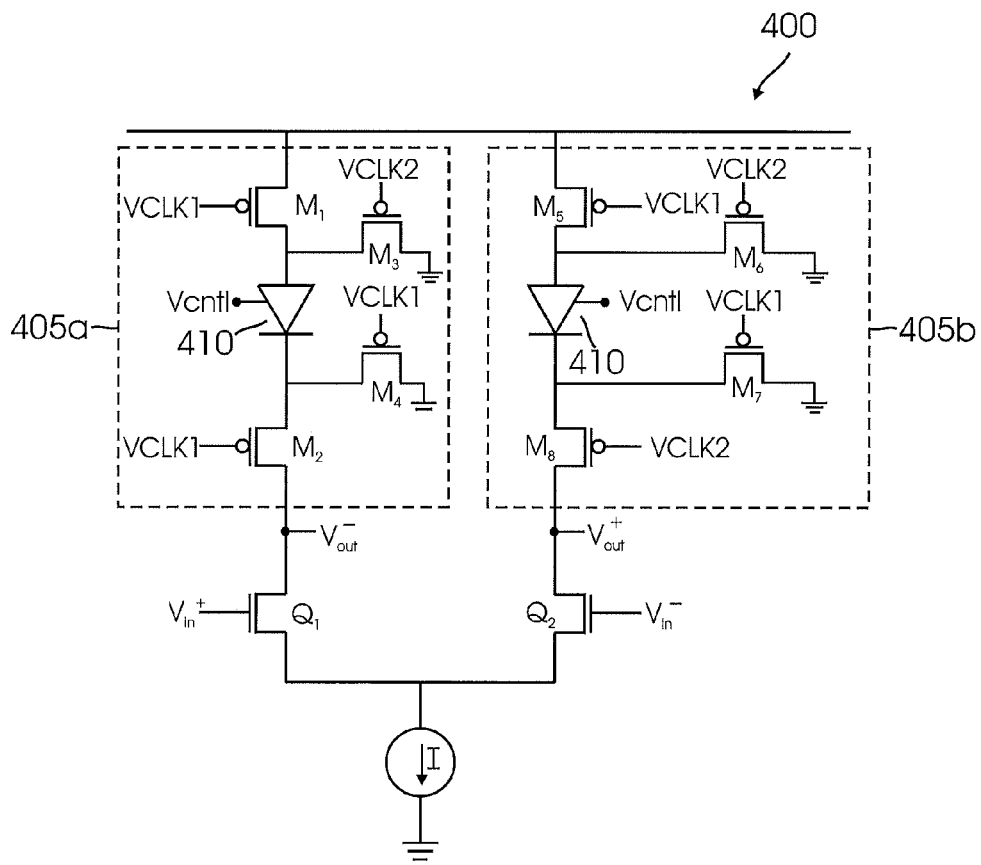
FIG. 4 is a schematic illustration of a self-compensating inverter stage for the voltage-controlled oscillator (VCO) of FIG. 1.

Turning now to FIG. 4, an inverter stage 400 advantageously uses switched capacitor circuits 405a and 405b to control the signal delay between its input nodes having voltages $V_{in}^+$ and $V_{in}^-$ and its output nodes having voltages $V_{out}^+$ and $V_{out}^-$. To provide a tuning capability for output frequency changes, the capacitor C discussed with regard to FIG. 3 is replaced by a variable capacitor such as a varactor 410. Switched capacitor circuit 405a includes a pair of PMOS transistors M1 and M2 that are driven by a switching voltage signal $V_{clk1}$ and a non-overlapping clock signal $V_{clk2}$. A pair of transistors M3 and M4 ground a terminal of varactor 410 analogously as discussed with regard to the capacitor of FIG. 3. Referring back to FIG. 2, it can be seen that switched capacitor circuit 405a replaces PMOS transistor M2 of inverter stage 101. Similarly, a switched capacitor circuit 405b replaces PMOS transistor M3 of inverter stage 101. Switched capacitor circuit 405b includes PMOS transistors M5, M6, M7, and M8 that function analogously to transistors M1, M3, M4, and M2 (respectively) for switched capacitor circuit 405a. Transistors Q1 and Q2 function similarly in both inverter stage 400 and inverter stage 101. In switched capacitor circuit 405a, a varactor 410 couples between the drain of M1 (and also the source of M2) and ground. The control voltage $V_{cntl}$ controls the capacitance of varactor 410 which will control the output frequency of a VCO incorporating inverter stage 400 as will be discussed further herein. Switched capacitor circuit 405b includes a pair of PMOS transistors M5 and M8 that are driven by the switching voltage signal $V_{clk1}$ and the non-overlapping clock signal $V_{clk2}$, respectively. A varactor 410 couples between the drain of M5 and the source of M8. The control voltage $V_{cntl}$ also controls the capacitance of varactor 410 in switched capacitor circuit 405b.

Figure 5:
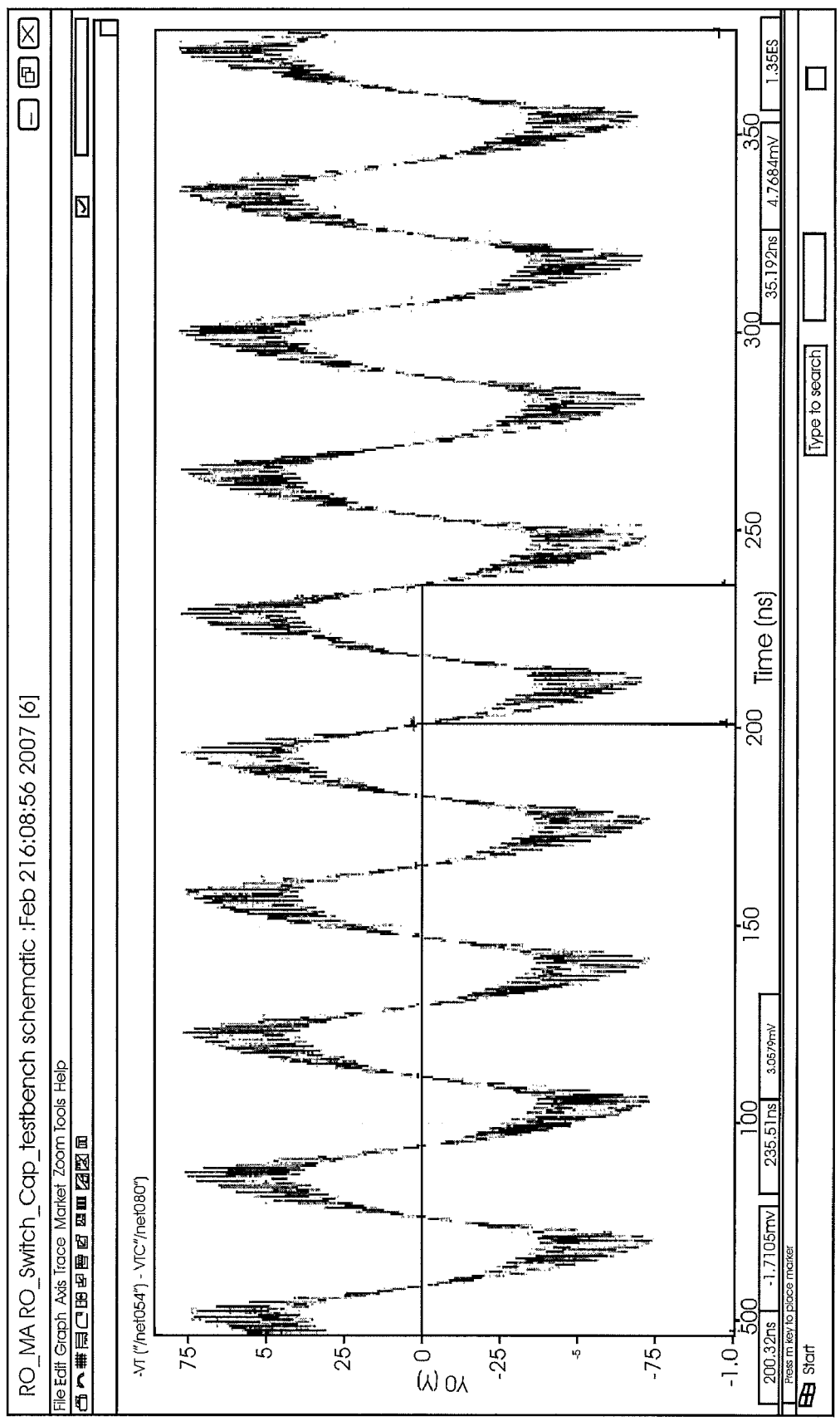
FIG. 5 illustrates simulation results of the output frequency for a self-compensated VCO at a temperature of 0° C.
Figure 6:
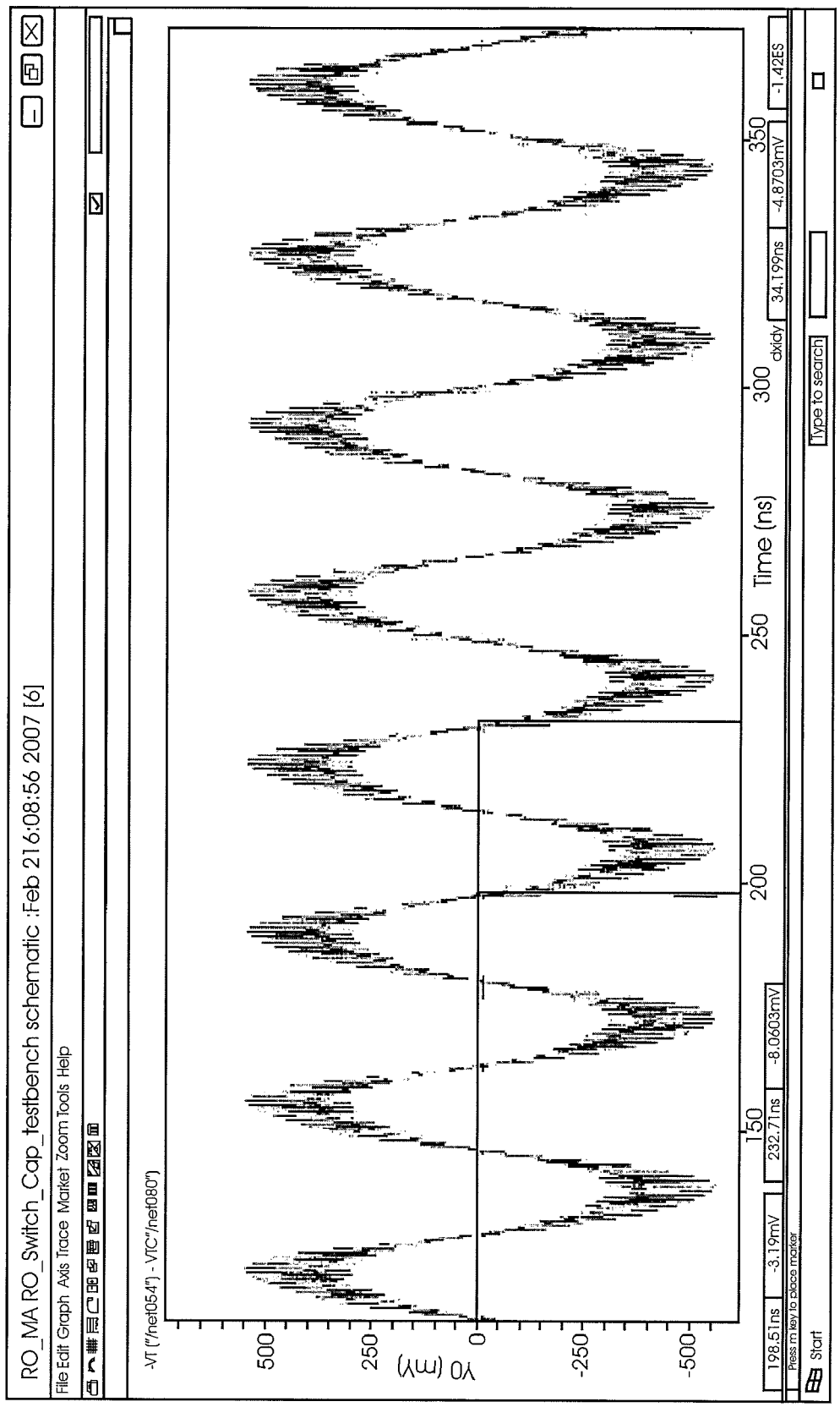
FIG. 6 illustrates simulation results of the output frequency for a self-compensated VCO at a temperature of 120° C.

The inclusion of switched capacitor circuits such as 405a and 405b leads to the following advantageous result. In general, an output frequency $f_{VCO}$ of a VCO such as VCO 100 of FIG. 1 has the proportionality $$f_{vco} \propto \frac{1}{RC} \quad (4)$$

where R is the resistance of the triode mode transistors in inverter stages 101 and C is the parasitic capacitances of the inverter stage components. As discussed analogously with regard to FIG. 3, it can be shown that the resistance of switched capacitor circuits 405a and 405b is given by $$R = \frac{1}{f_{clk} C_1} \quad (5)$$

where $C_1$ represents the capacitance of varactors 410 (a metal-insulator-metal capacitor, MOS capacitor, or other suitable tuning element may be used instead of a varactor). If a VCO such as VCO 100 is constructed using a plurality of inverter stages 400, its output frequency $f_{VCO}$ thus has the proportionality of $$f_{vco} \propto \frac{f_{clk} C_1}{C} \tag{6}$$

where C is the parasitic capacitance of the components in inverter stages 400. Note the intrinsic self-compensation thus provided by such a relationship: whatever process corner (fast or slow) that is used to construct inverter stages 400 will affect $C_1$ and C in substantially the same fashion. Thus, any semiconductor process variation effect on VCO output frequency response is inherently cancelled. Similarly, whatever temperature change effect that occurs to $C_1$ will occur in substantially the same fashion for C. Thus, any temperature variation effect on VCO output frequency response is also inherently cancelled. In this fashion, both temperature compensation and semiconductor process variation compensation is achieved without the use of any compensation circuitry, thereby leading to manufacturing cost and design efficiencies. For example, FIG. 5 illustrate the simulated output signal of a self-compensated VCO such as VCO 100 of FIG. 1 incorporating stages 400 of FIG. 4 at a temperature of 0° C. whereas FIG. 6 illustrates the simulated output signal of the same VCO at a temperature of 120° C. Comparison of FIGS. 5 and 6 shows that the resulting output frequency $f_{VCO}$ for VCO 100 changes only approximately two to three per cent over such a temperature range without needing any compensation circuitry. In contrast, a VCO incorporating the prior art inverter stages of FIG. 2 would exhibit approximately a twenty-five per cent change over this temperature range.

Figure 1:
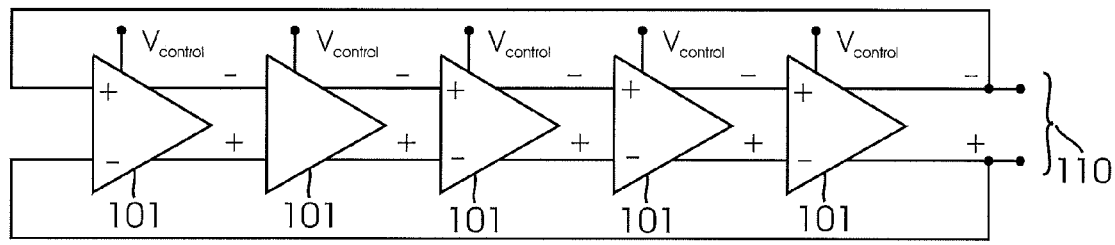
FIG. 1 is a block diagram of a voltage-controlled oscillator.
Figure 7:
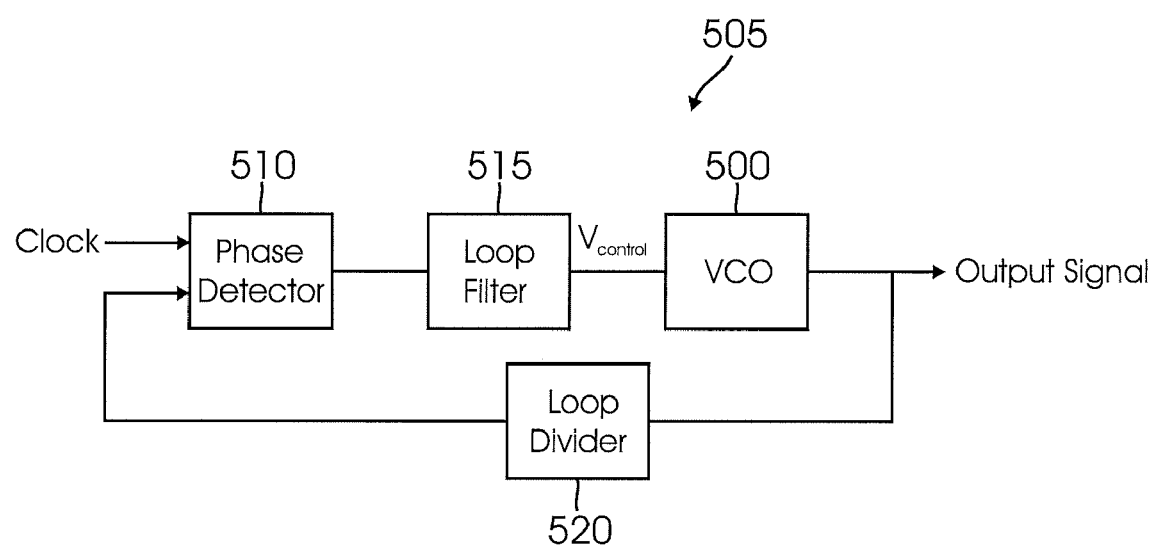
FIG. 7 is a block diagram of a phase-locked loop incorporating a self-compensated VCO.

It will be appreciated that the number of inverter stages used to construct a VCO as discussed herein need not be five as shown in FIG. 1. Indeed, if an inverter stage is connected in a non-inverting manner, an even number of stages may be used in the resulting VCO. Regardless of the number of stages used to construct the VCO, its self-compensating properties may be used for numerous applications. For example, as shown in FIG. 7, a VCO 500 having inverter stages whose signal delays are tuned by switching capacitor circuits such that the VCO output frequency is inherently compensated against process and temperature variations may be incorporated into a phase-locked loop (PLL) 505 that includes a phase detector 510, a loop filter 415, and a loop divider 520. VCO 500 responds to the control voltage $V_{cntl}$ as discussed above to control its output frequency. Advantageously, this output signal amplitude will not depend on the particular semiconductor process corner used to manufacture the integrated circuit forming VCO 500. Moreover, this output frequency will not depend on operating temperature changes.

It will be obvious to those skilled in the art that various changes and modifications may be made without departing from this invention in its broader aspects. For example, the voltage-controlled oscillator disclosed herein may be used in other applications besides phase locked loops. The appended claims encompass all such changes and modifications as fall within the true spirit and scope of this invention.

I claim:

1. A voltage-controlled oscillator (VCO), comprising:
a plurality of inverter stages coupled to form a loop, each inverter stage including a switched capacitor circuit configured to control a signal delay through the inverter stage responsive to a control voltage so as to control an output frequency for the VCO, wherein the switched capacitor circuit provides a resistance responsive to the control voltage and two non-overlapping clock signals and the signal delay is responsive to the resistance and whereby the output frequency for the VCO is inherently compensated against changes in semiconductor process variations and thermal variations.

2. The VCO of claim 1, wherein each inverter stage includes a differential pair of transistors configured to steer a tail current from a current source responsive to a differential pair of input voltages.

3. The VCO of claim 2, wherein the switched capacitor circuit in each inverter stage comprises a first switched capacitor circuit and a second switched capacitor circuit.

4. The VCO of claim 3, wherein the first switched capacitor circuit in each inverter stage isolates a first transistor in the differential pair of transistors from a supply voltage node, and wherein the second switched capacitor circuit in each inverter stage isolates a remaining transistor in the differential pair of transistors from the supply voltage node.

5. The VCO of claim 4, wherein the first and second switched capacitor circuits each comprises a pair of transistors coupled in parallel with regard to a varactor having its variable capacitance controlled by the control voltage.

6. The VCO of claim 1, wherein the plurality of inverter stages comprises an odd number of stages.

7. The VCO of claim 6, wherein the odd number of inverter stages comprises three inverter stages.

8. The VCO of claim 6, wherein the odd number of inverter stages comprises five inverter stages.

9. The VCO of claim 1, wherein the plurality of inverter stages coupled to form a loop further includes a non-inverting stage.

10. A phase-locked loop (PLL), comprising:
a phase detector operable to compare the phase between a divided signal and an input signal to provide a phase detector output;
a loop filter to filter the phase detector output to provide a tuning signal; and
a voltage-controlled oscillator (VCO), wherein the VCO comprises a plurality of inverter stages, each inverter stage including a switched capacitor circuit configured to control a signal delay through the inverter stage responsive to the tuning signal so as to control an output frequency for the PLL, wherein the switched capacitor circuit provides a resistance responsive to the tuning signal and two non-overlapping clock signals and the signal delay is responsive to the resistance and whereby the output frequency for the PLL is inherently compensated against changes in semiconductor process variations and thermal variations.

11. The PLL of claim 10, wherein each inverter stage includes a differential pair of transistors configured to steer a tail current from a current source responsive to a differential pair of input voltages.

12. The PLL of claim 11, wherein the switched capacitor circuit in each inverter stage comprises a first switched capacitor circuit and a second switched capacitor circuit.

13. The PLL of claim 12, wherein the first switched capacitor circuit in each inverter stage isolates a first transistor in the differential pair of transistors from a supply voltage node, and wherein the second switched capacitor circuit in each inverter stage isolates a remaining transistor in the differential pair of transistors from the supply voltage node.

14. The PLL of claim 13, wherein the first and second switched capacitor circuits each comprises a pair of transistors coupled in parallel with regard to a varactor having its variable capacitance controlled by the tuning signal.

15. The PLL of claim 10, wherein the plurality of inverter stages comprises an odd number of stages.

16. The PLL of claim 15, wherein the odd number of inverter stages comprises three inverter stages.

17. The PLL of claim 10, wherein the plurality of inverter stages coupled to form a loop further includes a non-inverting stage.

18. A ring oscillator, comprising:
an odd plurality of inverter stages coupled to form a loop, each inverter stage including a switched capacitor circuit configured to control a signal delay through the inverter stage responsive to a control voltage so as to control an output frequency for the ring oscillator, wherein the switched capacitor circuit provides a resistance responsive to the control voltage and two non-overlapping clock signals and the signal delay is responsive to the resistance and whereby the output frequency for the ring oscillator is inherently compensated against changes in semiconductor process variations and thermal variations.

19. The ring oscillator of claim 18, wherein each inverter stage includes a differential pair of transistors configured to steer a tail current from a current source responsive to a differential pair of input voltages.

20. The ring oscillator of claim 19, wherein the switched capacitor circuit in each inverter stage comprises a first switched capacitor circuit and a second switched capacitor circuit.

* * * * *